US007994809B2

(12) United States Patent
Akaike et al.

(10) Patent No.: US 7,994,809 B2
(45) Date of Patent: Aug. 9, 2011

(54) TRANSFER MECHANISM FOR TARGET OBJECT TO BE INSPECTED

(75) Inventors: Yutaka Akaike, Nirasaki (JP); Hiroshi Yamada, Nirasaki (JP); Tomoya Endo, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 260 days.

(21) Appl. No.: 12/492,676

(22) Filed: Jun. 26, 2009

(65) Prior Publication Data

US 2010/0001751 A1 Jan. 7, 2010

(30) Foreign Application Priority Data

Jul. 1, 2008 (JP) ................................ 2008-172577

(51) Int. Cl.
*G01R 31/20* (2006.01)
*G01R 31/00* (2006.01)

(52) U.S. Cl. ............................. 324/757.01; 324/750.03

(58) Field of Classification Search ............ 324/750.13, 324/757.01
See application file for complete search history.

(56) References Cited

U.S. PATENT DOCUMENTS 3,371,780 A * 3/1968 Clark ............................ 209/3.1
3,560,849 A * 2/1971 Ryan et al. .................... 324/419
6,739,208 B2 5/2004 Hyakudomi
6,791,346 B2 * 9/2004 Mehta et al. ............ 324/750.13
6,857,838 B2 * 2/2005 Kuroda ................... 414/331.01
2007/0152655 A1 * 7/2007 Ham et al. ................ 324/158.1

FOREIGN PATENT DOCUMENTS

JP 2002-64132 2/2002
JP 2007-288101 11/2007

* cited by examiner

*Primary Examiner* — Huy Phan
*Assistant Examiner* — Joshua Benitez
(74) *Attorney, Agent, or Firm* — Oblon, Spivak, McClelland, Maier & Neustadt, L.L.P.

(57) ABSTRACT

A transfer mechanism for a target object includes at least two insulating wire materials disposed spaced from each other to transverse a mounting table, at least two pairs of supporting bodies horizontally disposed at outsides of the mounting table, for stretching said at least two wire materials in parallel with a mounting surface of the mounting table, and at least two grooves formed on the mounting surface of the mounting table to respectively receive therein said at least two wire materials by said at least two pairs of supporting bodies. The transfer mechanism further includes a first elevation driving mechanism for vertically moving said wire materials between said grooves and above of the mounting surface through said pairs of supporting bodies, wherein the target object is transferred between a carrying mechanism and the mounting table through said at least two wire materials.

6 Claims, 9 Drawing Sheets

TRANSFER MECHANISM FOR TARGET OBJECT TO BE INSPECTED

CROSS-REFERENCE TO RELATED APPLICATIONS

This application claims priority to Japanese Patent Application No. 2008-172577, filed on Jul. 1, 2008, the entire contents of which are hereby incorporated by reference.

FIELD OF THE INVENTION

The present invention relates to a transfer mechanism for a target object to be inspected which is used for a probe apparatus for inspecting electrical characteristics of the target object such as a semiconductor wafer or the like; and, more particularly, to a transfer mechanism for the target object which can improve reliability of inspection.

BACKGROUND OF THE INVENTION

A conventional probe apparatus includes a loader chamber 1 and a prober chamber 2 arranged adjacent to each other as shown in, e.g., FIG. 6. The loader chamber 1 includes a cassette receiving part for receiving a cassette containing a plurality of semiconductor wafers W therein, a wafer carrying mechanism for transferring the semiconductor wafers W taken out of the cassette one by one, and a pre-alignment mechanism for pre-aligning the semiconductor wafer W while transferring the semiconductor wafer W by the wafer carrying mechanism. The prober chamber 2 has a mounting table 3 which is movable in X, Y, Z and θ directions while mounting thereon a semiconductor wafer W, a probe card 4 having a plurality of probes 4A to be brought into electrical contact with electrode pads of devices formed on the semiconductor wafer W mounted on the mounting table 3, a fixing mechanism 5 for fixing the probe card 4 through a card holder (not shown), and a connecting ring 6 for electrically connecting the probe card 4 and a test head T.

The conventional probe apparatus is configured to inspect electrical characteristics of each of the devices by transmitting and receiving test signals between a tester (not shown) and the electrode pads of each of the devices formed on the semiconductor wafer W via the test head T, the connecting ring 6 and the probe card 4.

Further, in FIG. 6, reference numeral '7' indicates an alignment mechanism for performing position-alignment of the semiconductor wafer W and the probe card 4 in cooperation with the mounting table 3; reference numerals '7A' and '7B' represent an upper camera and a lower camera, respectively; and reference numeral '8' indicates a head plate to which the fixing mechanism 5 of the probe card 4 is attached.

Further, as illustrated in, e.g., FIG. 7, the mounting table 3 has a mounting table main body 3A, a mounting body 3B movable vertically with respect to the mounting table main body 3A, and a transfer mechanism for the semiconductor wafer W.

The transfer mechanism has through holes formed at three locations spaced apart from each other at regular intervals in a circumferential direction on the mounting body 3B and three elevating pins 3C movable vertically in the through holes. While the semiconductor wafer W is transferred by the wafer carrying mechanism 9, the three elevating pins 3C protrude upward from the mounting surface of the mounting body 3B to be in ready for receiving the semiconductor wafer W.

Next, the wafer carrying mechanism 9 is lowered, and the semiconductor wafer W is delivered to the three elevating pins 3C. Thereafter, the wafer carrying mechanism 9 is retreated from the mounting body 3B into the loader chamber 1. The three elevating pins 3C being received the semiconductor wafer W are lowered and retreated into the mounting body 3B and the semiconductor wafer W is mounted on the mounting body 3B. The semiconductor wafer W is held on the mounting surface of the mounting body 3B by vacuum adsorption. Next, the alignment mechanism 7 performs alignment of the semiconductor wafer W in cooperation with the mounting table 3, and the semiconductor wafer W on the mounting table 3 is brought into electrical contact with the probes 4A of the probe card 4, thereby inspecting electrical characteristics of the semiconductor wafer W.

However, in the conventional transfer mechanism for a semiconductor wafer W, the through holes which allow the elevating pins 3C to pass therethrough are formed at three locations, so that leakage of electromagnetic waves from the lower portions of the through holes toward the semiconductor wafer W can be occurred. This causes electrical noise during inspection of devices formed on the semiconductor wafer W, which may adversely affect the inspection result. Further, in the case that devices generate heat, the semiconductor wafer W can be cooled to a predetermined inspection temperature by a temperature control mechanism provided at the mounting table 3. However, it is not possible to cool down devices formed at portions corresponding to the three through holes. Accordingly, heat spots may be generated, and the inspection may not be performed at the required inspection temperature. Moreover, in the case of devices to be inspected by applying a high voltage, abnormal discharge may occur in the through holes during the inspection.

The above-described elevating pins have been widely used conventionally. For example, elevating pins described in Japanese Patent Laid-open Application No. 2002-64132 and correspond U.S. Pat. No. 6,739,208 are different from those shown in FIG. 7 in that they are used to transfer a curved semiconductor wafer. These elevating pins are made to project upward from the mounting table with different projection amounts to incline the curved semiconductor wafer. This makes is possible to reliably transfer the semiconductor wafer W between the wafer carrying mechanism and the mounting table. In addition, elevating pins described in Japanese Patent Laid-open Application No. 2007-288101 are substantially the same as those illustrated in FIG. 7 which are widely used in general.

SUMMARY OF THE INVENTION

In view of the above, the present invention provides a transfer mechanism for a target object to be inspected which can perform highly reliable inspection with high accuracy without generating electrical noise, heat spots or the like.

In accordance with an aspect of the present invention, there is provided a transfer mechanism for a target object to be inspected which transfers the target object between a carrying mechanism and a mounting table in order to inspect electrical characteristics of the target object mounted on the mounting table of which temperature is controllable.

The transfer mechanism includes: at least two insulating wire materials disposed spaced apart from each other to transverse the mounting table; at least two pairs of supporting bodies disposed at outsides of the mounting table in a horizontal direction thereof, for stretching respective said at least two wire materials in parallel with a mounting surface of the mounting table; at least two grooves formed on the mounting surface of the mounting table to respectively receive therein said at least two wire materials stretched by said at least two pairs of supporting bodies; and a first elevation driving mechanism for vertically moving said at least two wire materials between said at least two grooves and above of the mounting surface through said at least two pairs of supporting bodies, wherein target object is transferred between the carrying mechanism and the mounting table through said at least two wire materials.

Further, the mounting table may include a mounting table main body, a mounting body movable vertically with respect to the mounting table main body, and a second elevation driving mechanism also serving as the first elevation driving mechanism for elevating the mounting body, wherein the mounting body may have stopper plates to bring into contact with lower ends of the respective supporting bodies and elevation guide mechanisms for guiding vertical movement of the respective supporting bodies.

The mounting table may also include a mounting table main body and a mounting body provided above the mounting table main body, and wherein the mounting body has at least two pairs of cylinder mechanisms as the first elevation driving mechanism, each pair connected with lower ends of said at least two pairs of supporting bodies and elevation guide mechanisms for guiding vertical movement of said at least two pairs of supporting bodies, respectively.

Each pair of the supporting bodies may have therein respective spring member connected with opposite end of each of the wire materials, and the spring members may apply tensile force to the respective wire materials.

In accordance with the present invention, it is possible to provide a transfer mechanism for a target object to be inspected which can perform highly reliable inspection with high accuracy without generating electrical noise, heat spots or the like.

BRIEF DESCRIPTION OF THE DRAWINGS

The objects and features of the present invention will become apparent from the following description of embodiments, given in conjunction with the accompanying drawings, in which:

FIGS. 1A to 1D show a transfer mechanism for a target object to be inspected in accordance with a first embodiment of the present invention, wherein FIG. 1A is a side view, FIG. 2 describes a support as a principal part, FIG. 3 provides a top view, and FIG. 1D depicts a partially cutaway cross sectional view of a mounting body;

DETAILED DESCRIPTION OF THE EMBODIMENTS

Hereinafter, embodiments of the present invention will be described with reference to FIGS. 1A to 5C which form a part hereof.

First Embodiment

A transfer mechanism for a target object to be inspected (hereinafter, simply referred to as a “transfer mechanism”) in accordance with the first embodiment is used to transfer the target object (e.g., a semiconductor wafer) between a carrying mechanism for carrying the target object (hereinafter, referred to as a “wafer carrying mechanism”) which is provided in a loader chamber of a probe apparatus and a mounting table in a prober chamber. The loader chamber has a conventional configuration and the transfer mechanism is provided in the prober chamber. As in the conventional case, the prober chamber includes a mounting table capable of moving in X, Y, Z and θ directions, a probe card having a plurality of probes, an alignment mechanism and a control unit. After the semiconductor wafer mounted on the mounting table and the probe card are aligned under the control of the control unit, the semiconductor wafer is brought into electrical contact with the probe card, thereby inspecting electrical characteristics of the semiconductor wafer.

Figure 1A:
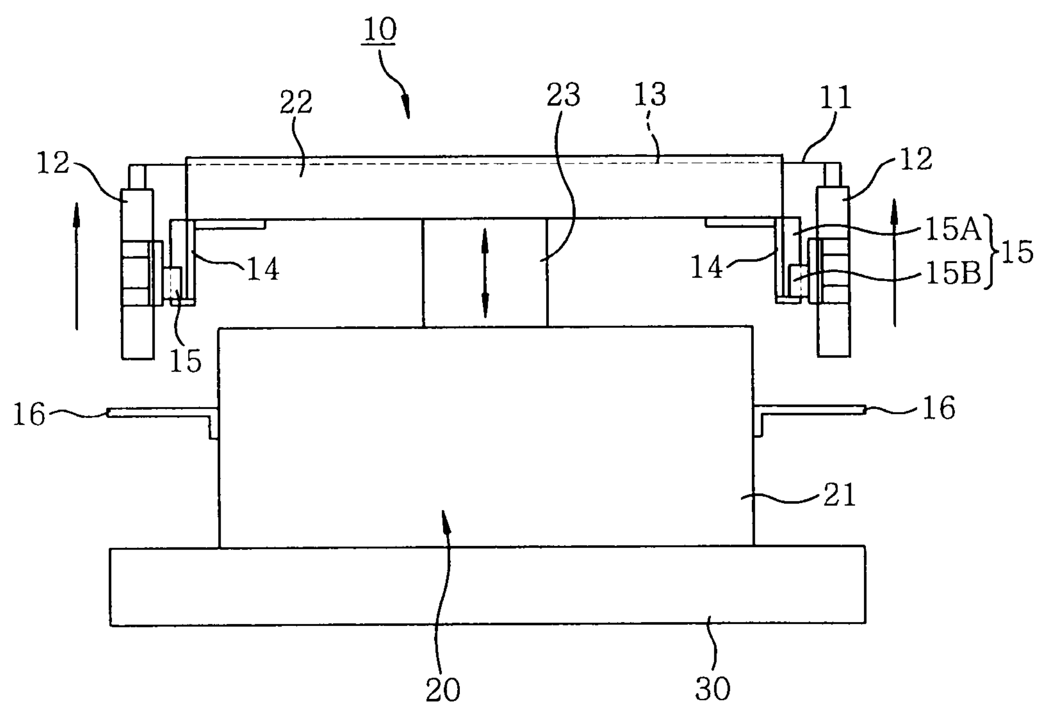
Figure 1B:
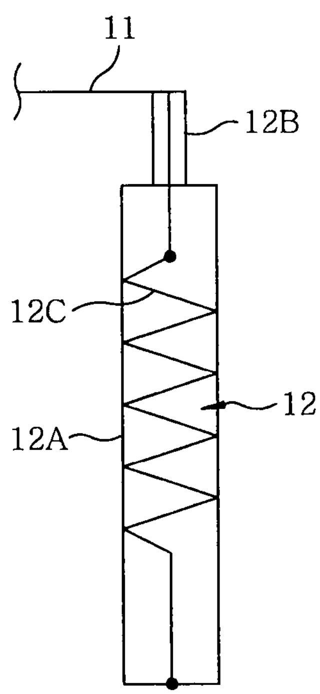
Figure 1C:
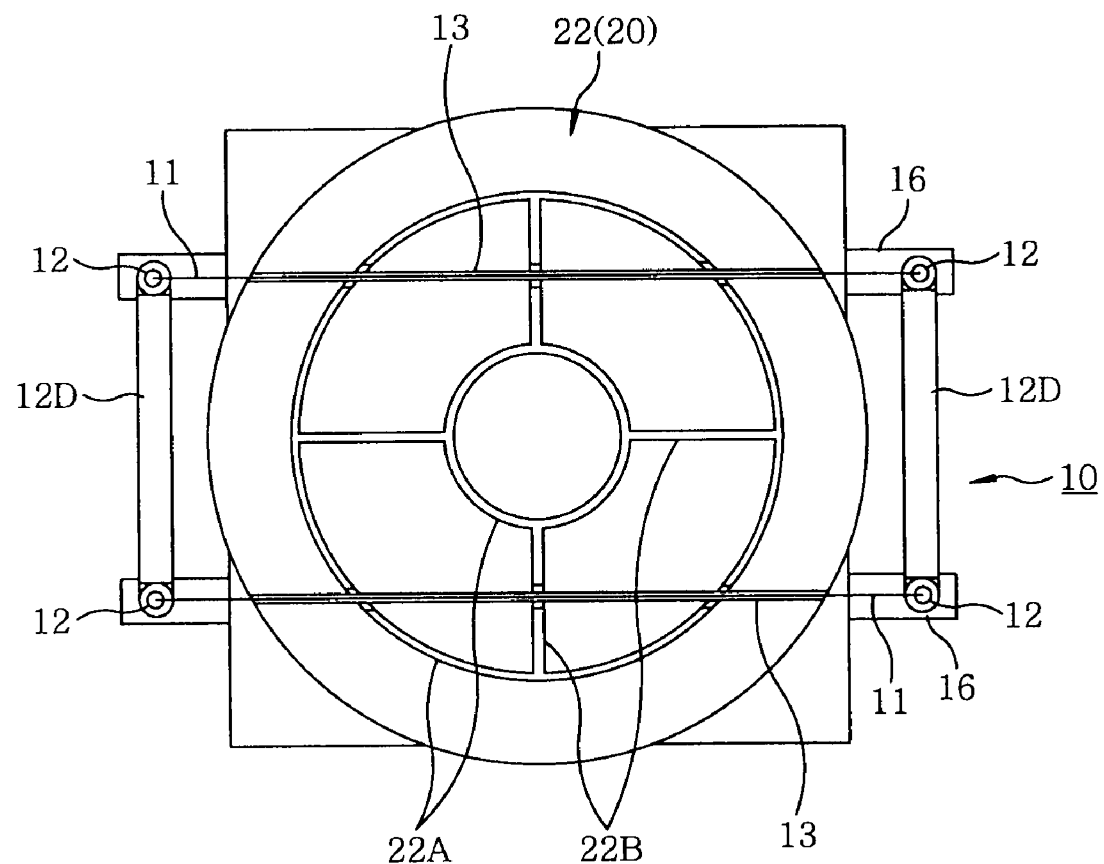

A transfer mechanism of the present embodiment is assembled to a mounting table 20 for mounting thereon the semiconductor wafer W, as illustrated in, e.g., FIGS. 1A and 1C. The mounting table 20 includes a mounting table main body 21, a mounting body 22 movable vertically with respect to the mounting table main body 21, and elevation driving mechanism 23 for vertically moving the mounting body 22 under the control of the control unit. The mounting table 20 is disposed on an XY table 30, and is configured to move in X and Y directions through the XY table 30.

The elevation driving mechanism 23 includes a ball screw having an upper end connected with the mounting body 22, a motor for driving the ball screw and a nut member screw-coupled with the ball screw, and the mounting body 22 is configured to move vertically with respect to the mounting table main body 21 via the elevation driving mechanism 23. Moreover, the mounting body 22 has a temperature control mechanism, and is configured to heat and cool the semiconductor wafer to a predetermined inspection temperature.

Besides, as shown in FIGS. 1A and 1C, the transfer mechanism 10 includes: two insulating and heat-resistant wire materials 11 (e.g., zylon: registered trademark of TOYOBO CO., LTD.) spaced apart from each other by a distance on the mounting table 20, more specifically on the mounting body 22, so as to transverse the mounting body 22; two pairs of supporting bodies 12 provided at outside of the mounting body 22 in the horizontal direction thereof, for stretching the wire materials 11 in parallel with the mounting surface of the mounting body 22; two grooves 13 formed on the mounting surface of the mounting body 22 to receive therein the respective wire materials 11 stretched by the supporting bodies 12, and the elevation driving mechanism 23 for vertically moving up the wire materials 11 from the grooves 13 on the mounting surface to above the mounting body 22 and moving down the wire materials 11 into the grooves 13.

When the elevation driving mechanism 23 is driven under the control of the control unit, the two wire materials 11 move vertically through the supporting bodies 12 and elevation guide mechanisms 15, so that the semiconductor wafer W (see FIGS. 3A and 3B) is transferred between a wafer carrying mechanism 40 (see FIGS. 3A and 3B) and the mounting body 22. In the present embodiment, as for the elevation driving mechanism 23 of the transfer mechanism 10 which is referred to as a first elevation driving mechanism, the elevation driving mechanism 23 of the mounting body 22, which is referred to as a second elevation driving mechanism, is used. That is, the second elevation driving mechanism for vertically moving the mounting body 22 serves as the first elevation driving mechanism. Therefore, in the present embodiment, the second elevation driving mechanism will be simply described as the elevation driving mechanism 23.

Further, in the present embodiment, the two wire materials 11 are provided instead of the conventional elevating pins and the two grooves 13 for receiving therein the two wire materials 11 are formed instead of the through holes where the elevating pins are received and moved vertically therethrough. The absence of the through holes makes it possible to prevent the conventional problems such as the leakage of electromagnetic waves from the bottom surface of the mounting body 22 toward the mounting surface, the generation of heat spots and the occurrence of discharge between the elevation pins and the through holes.

In other words, the two wire materials 11 are generally provided inside the two grooves 13 which are spaced apart from each other so as to transverse the mounting surface of the mounting body 22. The wire materials 11 are respectively connected with the two pairs of supporting bodies 12 having both ends disposed to have the mounting body 22 therebetween, and move vertically between the inside of the grooves 13 and above of the mounting surface of the mounting body 22 while being stretched by the two pairs of supporting bodies 12.

As shown in FIGS. 1A and 1C, the two pairs of supporting bodies 13 are vertically movably attached to the fixed members 14 fixed to a periphery of a bottom surface of the mounting body 22. The fixed members 14 include horizontal portions connected with the periphery of the bottom surface of the mounting body 22 along the diametrical direction thereof and vertical portions suspended from outer ends of the respective horizontal portions. The supporting bodies 12 are vertically movably attached to the vertical portions of the fixed members 14 via the elevation guide mechanisms 15.

The elevation guide mechanisms 15 have vertically extending linear guides 15A fixed to the vertical portions of the fixed members 14 and engaging members 15B to be engaged with the linear guides 15A. The two wire materials 11 are moved vertically between the grooves 13 in which the two wire materials 11 are respectively received and above of the mounting surface of the mounting body 22 by moving the supporting bodies 12 vertically along the linear guide 15A via the engaging member 15B.

As shown in FIG. 1B, each of the supporting bodies 12 includes a cylindrical body 12A, a cylindrical protrusion 12B projecting upward from an upper end of the cylindrical body 12A while being coaxial with the cylindrical body 12A, and a spring member 12C provided in the cylindrical body 12A. Further, as illustrated in FIG. 1C, two adjacent supporting bodies 12 are connected with each other by a connecting member 12D to maintain the distance therebetween. Moreover, the spring member 12C in the cylindrical body 12A has an upper end connected with an end portion of the corresponding wire material 11 and a lower end fixed to a bottom surface of the cylindrical body 12A, and applies tensile force to the corresponding wire material 11. That is, each pair of supporting bodies has therein respective spring member connected with opposite end of each of the wire materials 11, and the spring members apply tensile force to the respective wire materials. Thus, due to the constant application of the tensile force by the spring member 12C, the wire materials 11 do not lose their tension even if the wire materials 11 are extended or contracted by the temperature of the mounting body 22, thereby reliably supporting the semiconductor wafer.

Figure 1D:
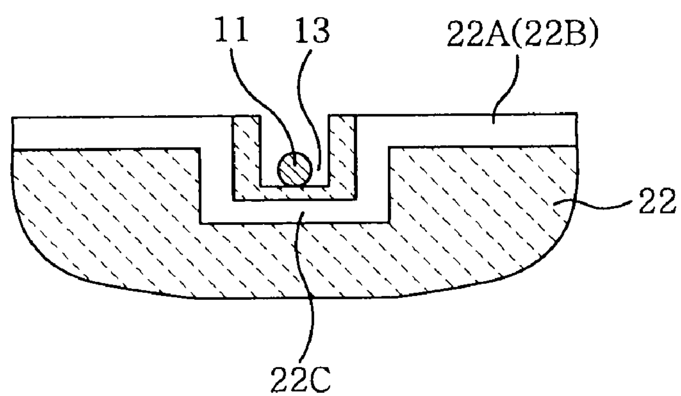

As depicted in FIG. 1D, the width and the depth of the grooves 13 formed on the mounting surface of the mounting body 22 are greater than the thickness of the wire materials 11, and the wire materials 11 are brought into contact with the bottom surfaces of the grooves 13 when the supporting bodies 12 reach the lowermost end. In the present embodiment, the thickness of the wire materials 11 is, e.g., about 0.2 mm; the width of the grooves 13 is, e.g., about 0.6 mm, and the depth of the grooves 13 is, e.g., about 1.0 mm.

Further, a plurality of circular first adsorption grooves 22A for vacuum-adsorbing the semiconductor wafer is formed in a concentric circular shape on the mounting surface of the mounting body 22, and these first adsorption grooves 22A communicate with each other by second adsorption grooves 22B formed in a diametrical direction of the mounting body 22. Openings are formed in desired portions of the first adsorption grooves 22A to be connected with a gas exhaust line (not shown) formed inside the mounting body 22. The first and the second adsorption grooves 22A and 22B intersect the grooves 13, as can be seen from FIG. 1C. At the intersection portions, the first and the second adsorption grooves 22A and 22B communicate with each other by a passageway 22C formed below the grooves 13, and the semiconductor wafer is adsorbed and held on the mounting surface through the first and the second absorption grooves 22A and 22B.

Further, as described in FIGS. 1A and 1C, two pairs of stopper plates 16 corresponding to the two pairs of supporting bodies 12 are fixed to side surfaces of the mounting body 21. The stopper plates 16 horizontally extend from the side surfaces of the mounting table main body 21 to correspond to the supporting bodies 12 provided thereabove.

While the mounting body 22 is lowered by the elevation driving mechanism 23 of the mounting table 20, the stopper plates 16 are brought into contact with the lower ends of the supporting bodies 12. The supporting bodies 12 are relatively moved up by the stopper plates 16 with respect to the fixed members 14 until the mounting body 22 reaches the lowermost position, so that the two pairs of wire materials 11 are raised from the mounting surface of the mounting body 22 by a predetermined distance. The supporting bodies 12 are raised vertically by the elevation guide mechanisms 15 while being relatively moved up by the stopper plates 16 with respect to the fixed members 14.

Figure 2A:
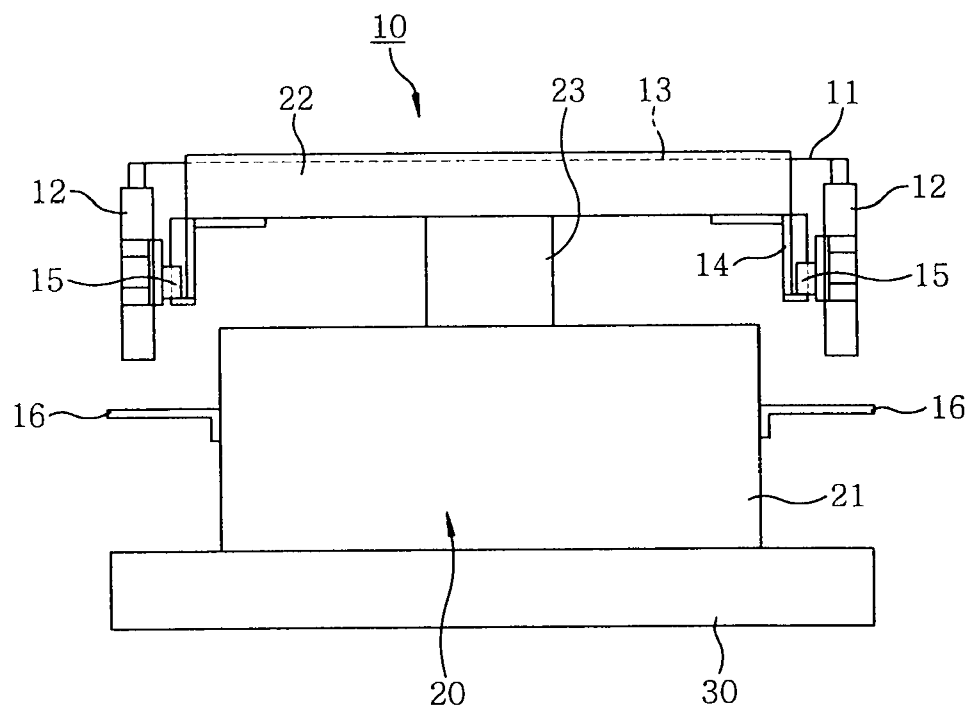
FIGS. 2A to 2C provide flowcharts sequentially describing an operation of receiving a semiconductor wafer on the mounting table by using the transfer mechanism shown in FIG. 1.
Figure 2B:
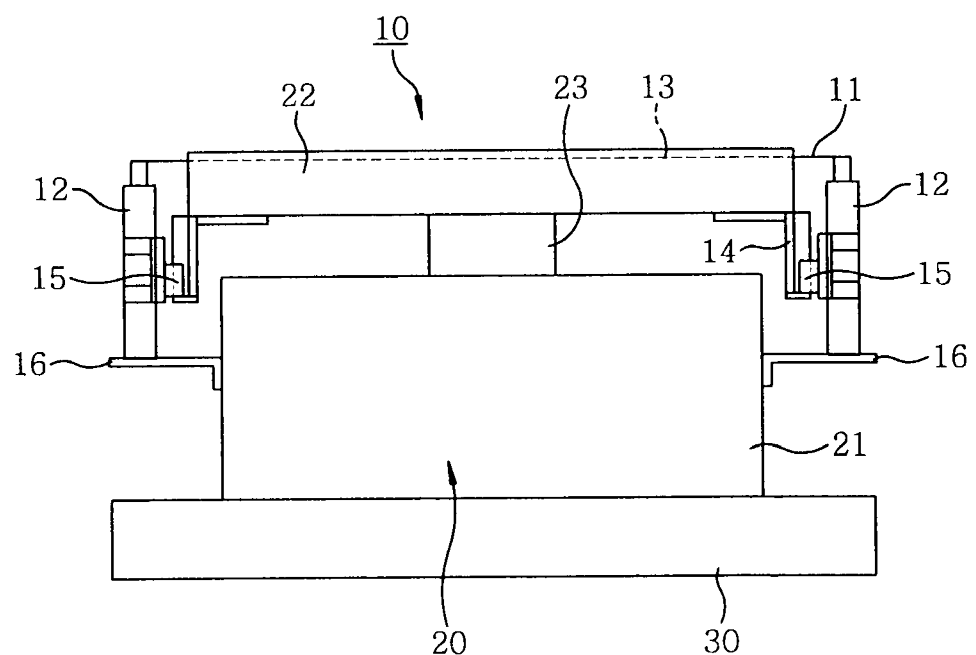
Figure 2C:
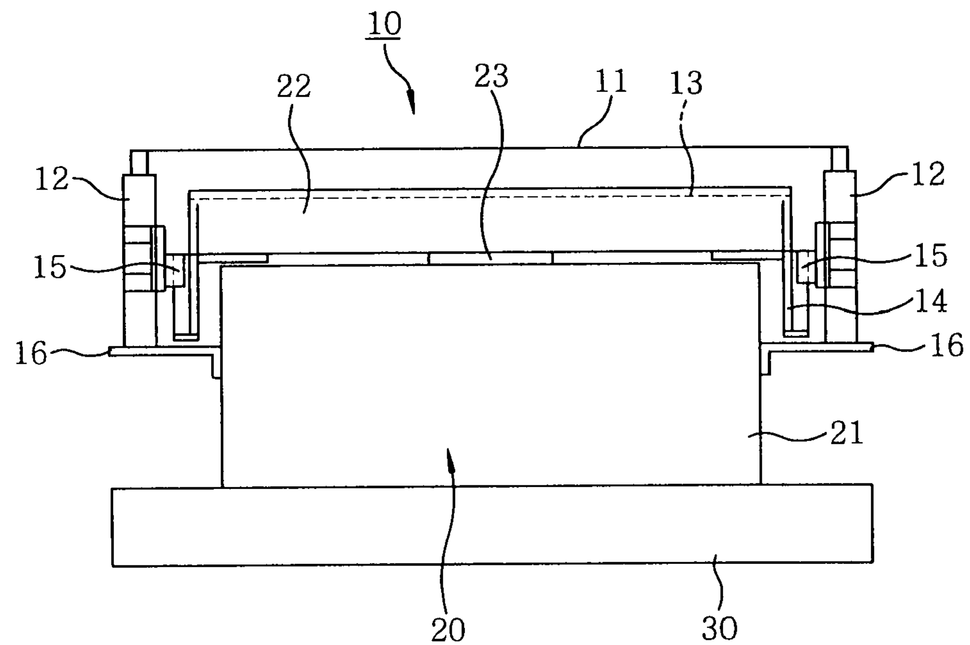

Hereinafter, an operation of the transfer mechanism 10 of the present embodiment will be described with reference to FIGS. 2A and 3C. The mounting table 20 moves toward the loader chamber via the XY table 30 under the control of the control unit to thereby wait for the semiconductor wafer, as shown in FIG. 2A. In order to transfer the semiconductor wafer from the wafer carrying mechanism 40 to the mounting table 20 (see FIGS. 3A and 3B), the mounting body 22 is lowered by the elevation driving mechanism 23, and the two pairs of supporting bodies 12 come into contact with the stopper plates 16 fixed to the mounting table main body 21, as illustrated in FIG. 2B.

When the mounting body 22 is further lowered to be close to the mounting table main body 21, the supporting bodies 12 are moved vertically upward by the stopper plates 16 relatively to the fixed members 14. Thus, the two wire materials 11 are raised from the grooves 13 of the mounting body 22 by a predetermined distance to thereby receive the semiconductor wafer, as described in FIG. 2C.

Figure 3A:
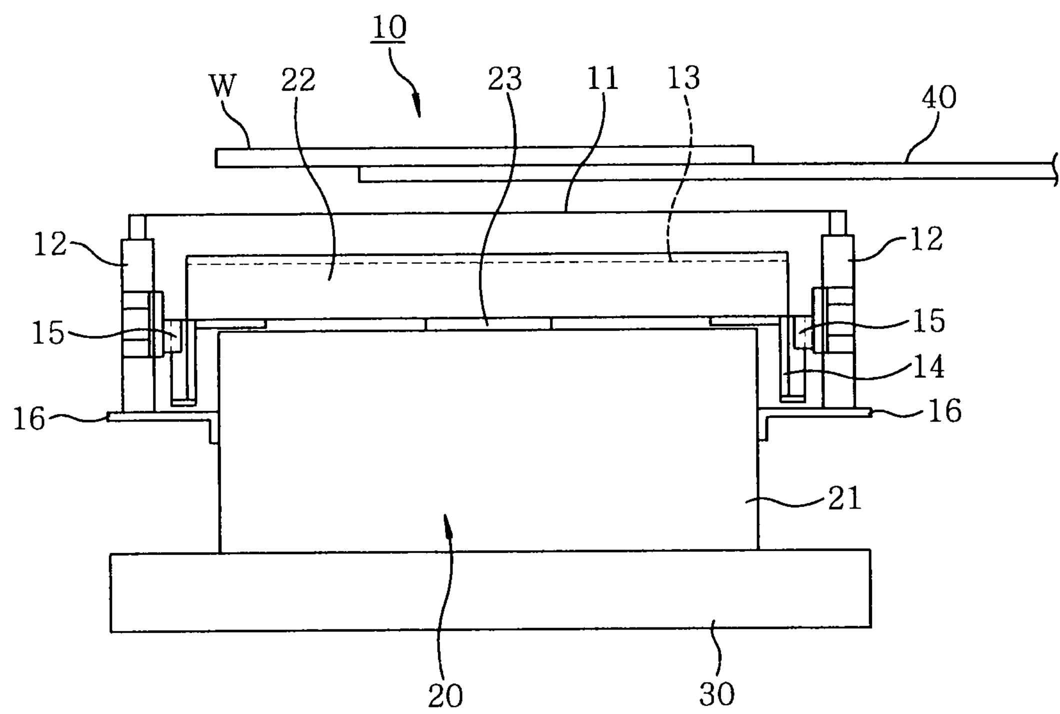
FIGS. 3A to 3C present flowcharts sequentially illustrating post-operations of the operation described in FIG. 2A to 2C.
Figure 3B:
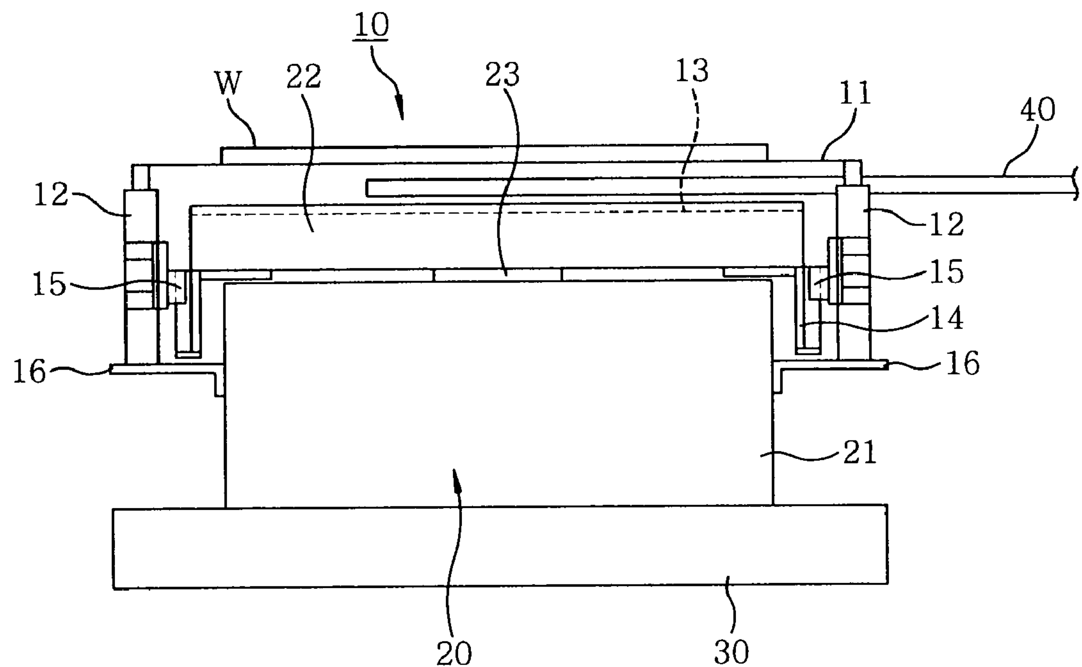
Figure 3C:
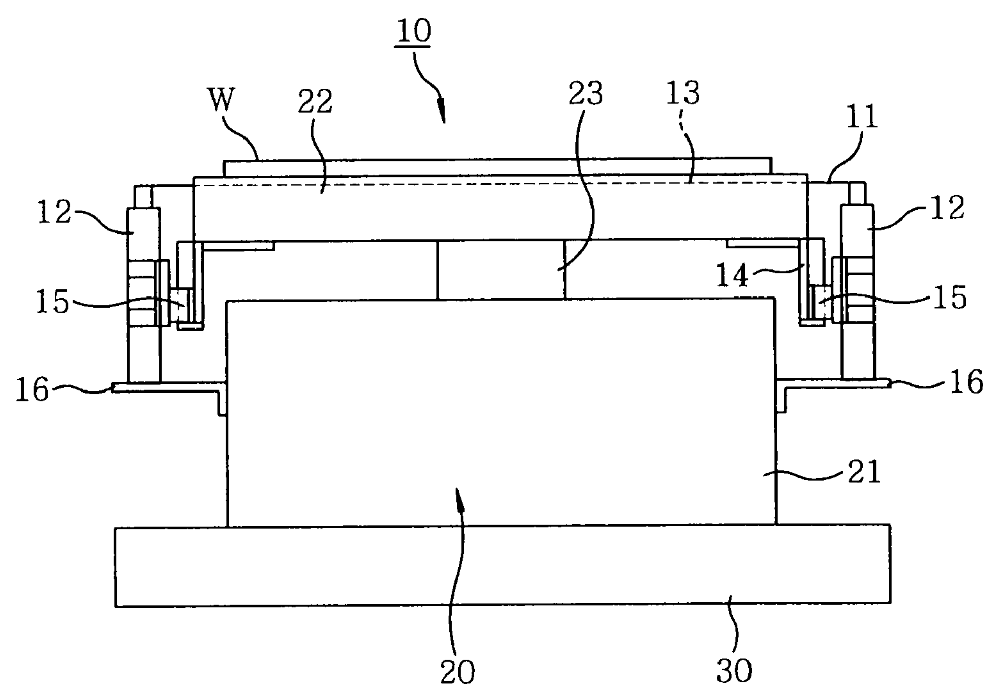

When the mounting table 20 is being in ready for receiving the semiconductor wafer, the wafer carrying mechanism 40 moves from the loader chamber toward above of the mounting table 20, and the semiconductor wafer W reaches directly above the mounting table 20, as illustrated in FIG. 3A. Thereafter, while the wafer carrying mechanism 40 is lowered in a space between the two wire materials 11 and the mounting surface of the mounting body 22, the semiconductor wafer W is delivered and mounted onto the two wire materials 11, as shown in FIG. 3B. Next, the wafer carrying mechanism 40 retreats from above of the mounting table 20 to the loader chamber and, the mounting body 22 is raised by the elevation driving mechanism 23. Further, the two wire materials 11 are received in the two grooves 13 of the mounting body 22 and, the semiconductor wafer W is mounted on the mounting surface of the mounting body 22.

Figure 4:
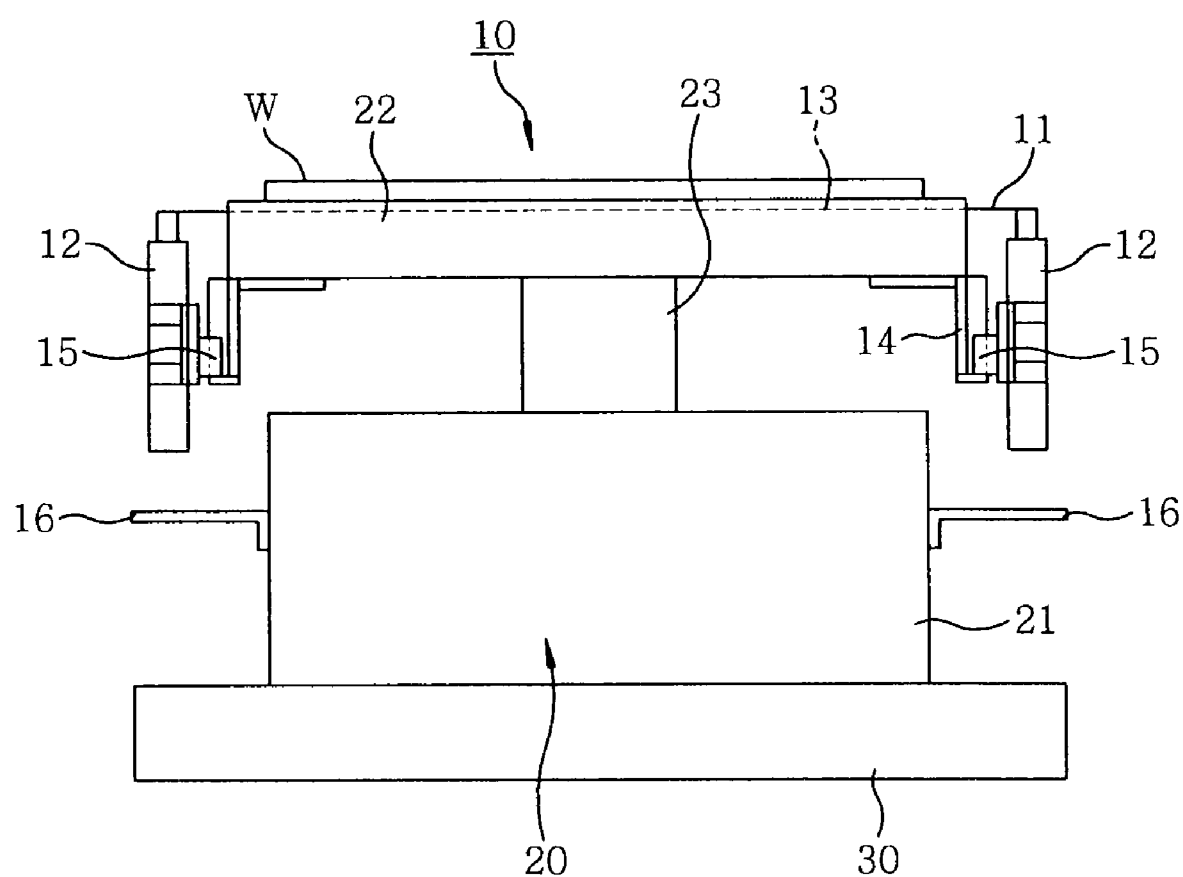
FIG. 4 offers a side view showing a state where the semiconductor wafer is mounted on the mounting table by using the transfer mechanism shown in FIGS. 1A to 1D.

Moreover, when the mounting body 22 is raised by the elevation driving mechanism 23, the two pairs of supporting bodies 12 are moved down relatively to the fixed members 14 through the elevation guide mechanism 15 while being supported by the stopper plates 16, and when the mounting body 22 is further raised, the supporting bodies 12 rise from the stopper plates 16, respectively, as shown in FIG. 4.

Next, while the mounting table 20 moves in X, Y, Z and θ directions, the alignment of the semiconductor wafer W and the probe card is carried out by the alignment mechanism. Thereafter, the mounting table 20 reaches a predetermined position below the probe card. In that position, the mounting body 22 is raised by the elevation driving mechanism 23. Accordingly, the semiconductor wafer W is brought into electrical contact with the probes of the probe card, thereby inspecting electrical characteristics of the semiconductor wafer W by the probes.

In such a case unlike in the conventional case, the mounting body 22 is not provided with through holes, so that the highly reliable inspection can be carried out with high accuracy while preventing leakage of electromagnetic waves from the bottom surface of the mounting body 22 toward the mounting surface and generation of electrical noise. In addition, unlike in the conventional case, the mounting body 22 is not provided with elevating pins and through holes, and the semiconductor wafer W is transferred by the two insulating and heat-resistant wire materials 11. Therefore, discharge does not occur in the mounting body 22, and devices of the semiconductor wafer W or the probes are not damaged.

Further, even in the case of performing high-temperature inspection for a vehicle-loaded device, the absence of through holes in the mounting body 22 makes it possible to uniformly cool the entire surface of the semiconductor wafer W without generating heat spots. As a consequence, highly reliable inspection can be carried out with high accuracy.

As described above, in accordance with the present embodiment, the transfer mechanism 10 includes: the two insulating and heat-resistant wire materials 11 disposed spaced apart from each other by a distance so as to transverse the mounting table 20 (the mounting body 22); the two pairs of supporting bodies 12 disposed at the outside of the mounting body 22 in the horizontal direction thereof, for stretching the wire materials 11 in parallel with the mounting surface of the mounting body 22; the two grooves 13 formed on the mounting surface of the mounting body 22 to receive therein the respective wire materials 11; and the elevation driving mechanism 23 for vertically moving the wire materials 11 between above of the mounting body 22 and the grooves 13.

In this configuration, when the elevation driving mechanism 23 is driven under the control of the control unit, the two wire materials 11 are raised through the supporting bodies 12 and the elevation guide mechanism 15, so that the semiconductor wafer W (see FIGS. 3A and 3B) is transferred between the wafer carrying mechanism 40 (see FIGS. 3A and 3B) and the mounting body 22. Accordingly, the highly reliable inspection can be performed with high accuracy without generating electrical noise or heat spots.

Further, in accordance with the present embodiment, the mounting table 20 includes the mounting table main body 21, the mounting body 22 movable vertically with respect to the mounting table main body 21, and the elevation driving mechanism 23 for vertically moving the mounting body 22 with respect to the mounting table main body 21. Moreover, the mounting table main body 21 has the stopper plates 16 to bring into contact with the lower ends of the two pairs of supporting bodies 12, and the mounting body 22 has the elevation guide mechanisms 15 to guide vertical movement of the respective supporting bodies 12. Accordingly, the semiconductor wafer W can be moved vertically with high accuracy by the elevation guide mechanisms 15, and semiconductor wafers can be mounted at the same position on the mounting surface of the mounting body 22.

Second Embodiment

Figure 5A:
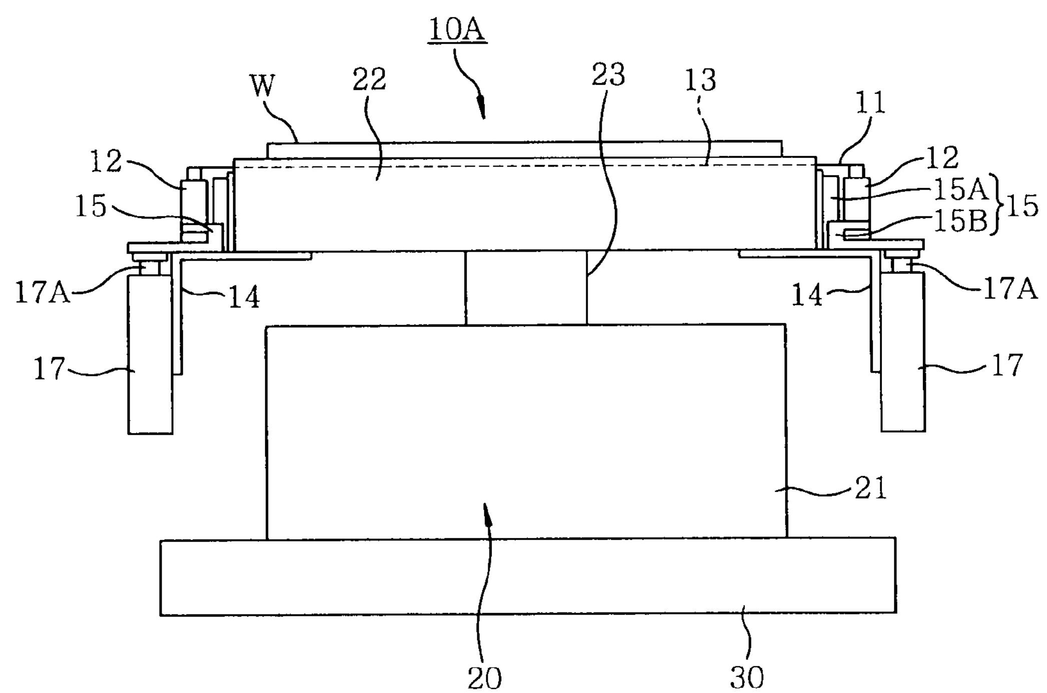
FIGS. 5A to 5C present flowcharts sequentially showing an operation of transferring the semiconductor wafer from the mounting table by using a transfer mechanism for a target object to be inspected in accordance with another embodiment of the present invention.
Figure 5B:
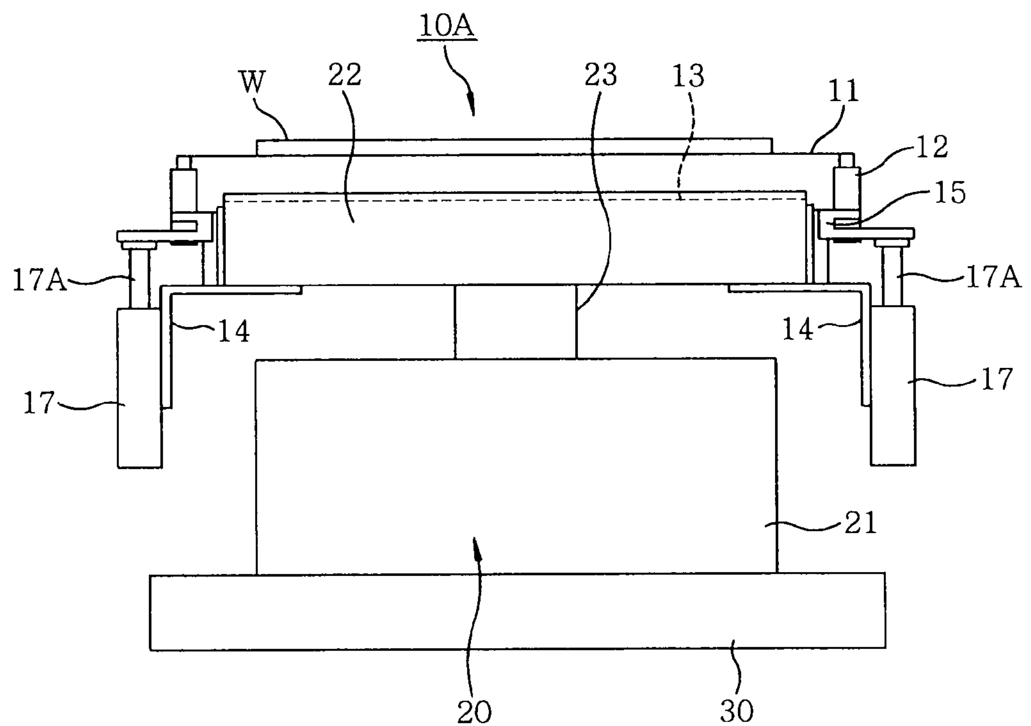
Figure 5C:
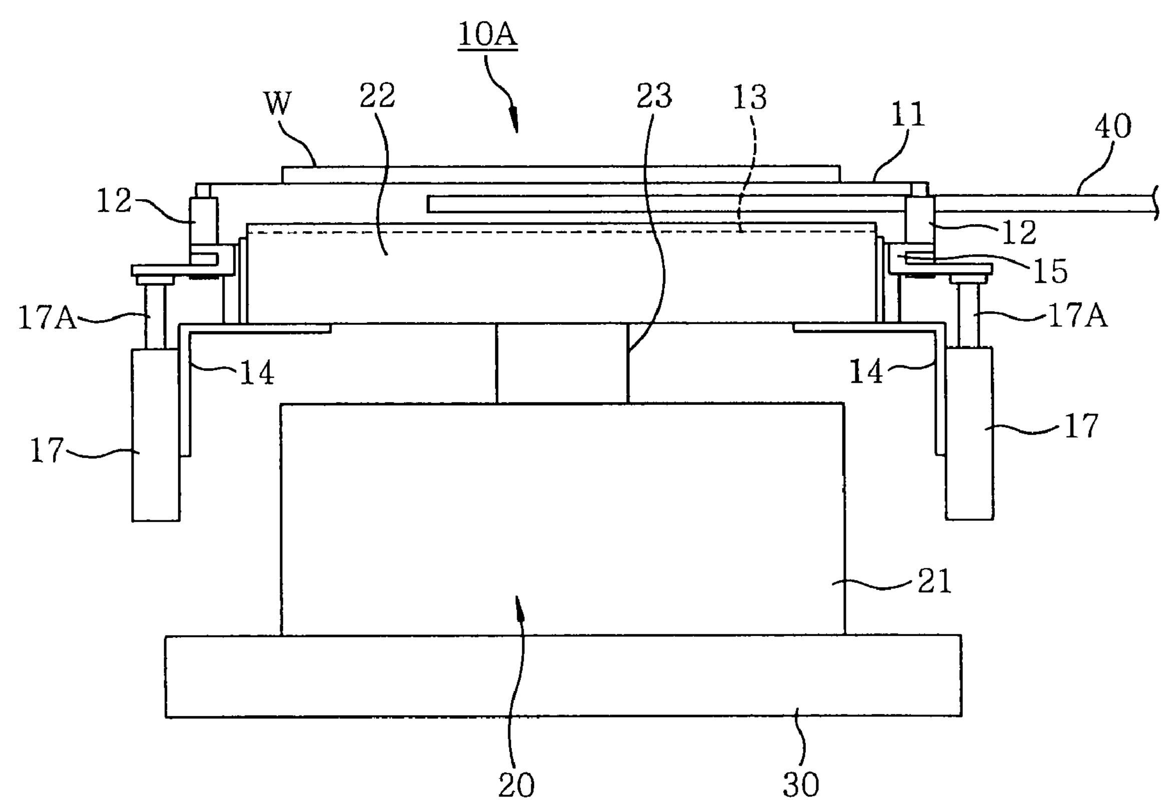
Figure 6:
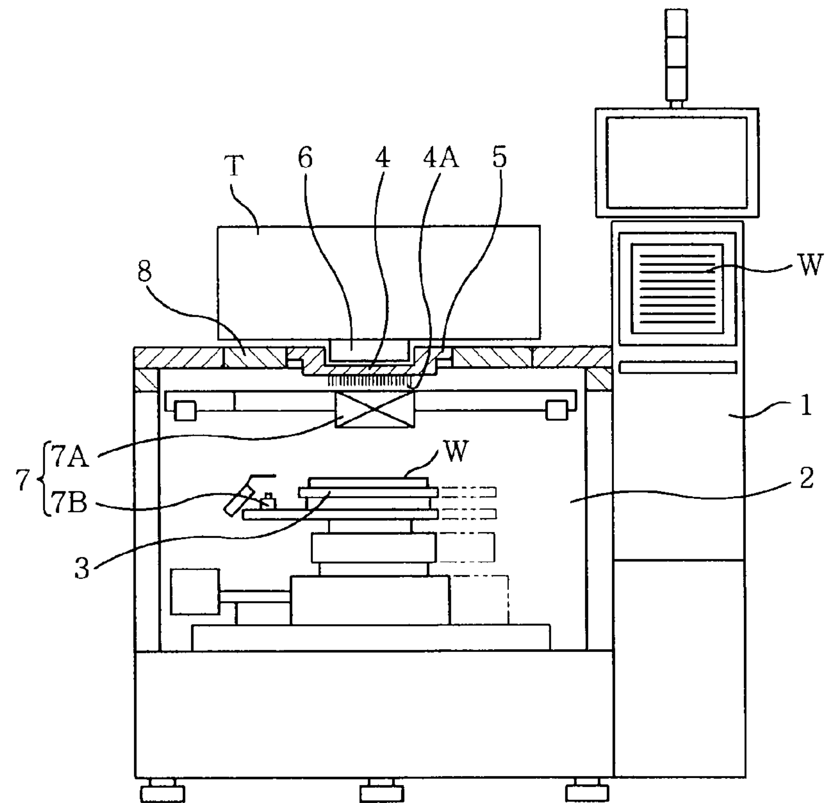
FIG. 6 depicts a partially cutaway front view of an example of a conventional probe apparatus.
Figure 7:
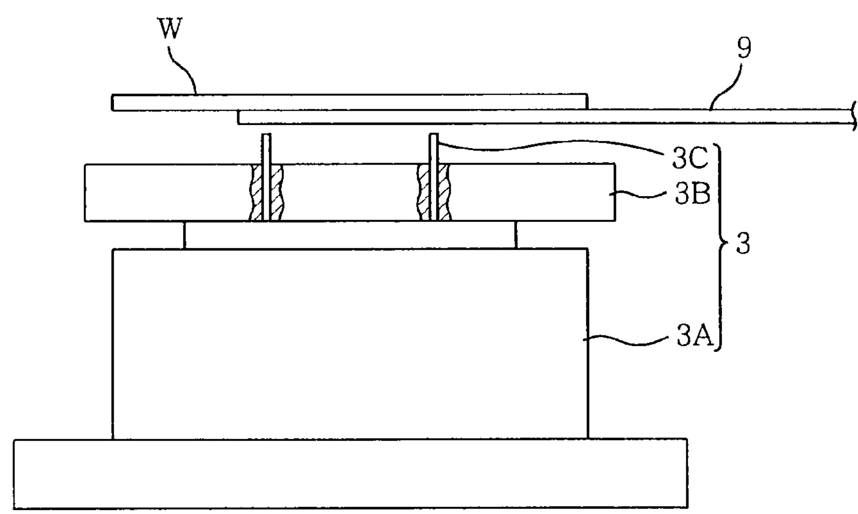
FIG. 7 sets forth a side view showing an example of a conventional transfer mechanism for a target object to be inspected which is used in the probe apparatus shown in FIG. 6.

A transfer mechanism 10A in accordance with the second embodiment is basically the same as that of the first embodiment except that there is provided an elevation driving mechanism for vertically moving only the wire materials as shown in FIGS. 5A to 5C. Therefore, in the present embodiment, the present invention will be described by giving like reference numerals to like or corresponding parts of the first embodiment.

As shown in, e.g., FIGS. 5A to 5C, in the transfer mechanism 10A of the present embodiment, cylinder mechanisms 17 serving as a first elevation driving mechanism are provided at vertical portions of the fixed members 14 fixed on the bottom surface of the mounting body 22 to correspond to the two pairs of supporting bodies 12. Upper ends of rods 17A of the cylinder mechanisms 17 are connected with lower ends of the supporting bodies 12.

The rods 17A are extended and contracted by the cylinder mechanisms 17 under the control of the control unit to move the supporting bodies 12 vertically. The two pairs of supporting bodies 12 move vertically along the side surfaces of the mounting body 22 through the elevation guide mechanisms 15 attached to the side surfaces of the mounting body 22 in a vertical direction of the mounting body 22 and, further, the two wire materials 11 move vertically between the grooves 13 of the mounting body 22 and above of the mounting body 22.

In the present embodiment, the cylinder mechanisms 17 serve as the first elevation driving mechanism for vertically moving only the wire materials 11 via the supporting bodies 12, and the second elevation driving mechanism 23 serves as an elevation driving mechanism for vertically moving only the mounting body 22.

Hereinafter, an operation of the transfer mechanism 10A of the present embodiment will be described with reference to FIGS. 5A to 5C. FIGS. 5A to 5C show an operation of transferring an inspected semiconductor wafer W on the mounting table 20 to the wafer carrying mechanism 40. When the inspection of the semiconductor wafer W is completed, the mounting table 20 moves toward the loader chamber and waits for the wafer carrying mechanism 40.

That is, as illustrated in FIG. 5A, the mounting table 20 waits while mounting thereon the inspected semiconductor wafer W. In order to transfer the semiconductor wafer W from the mounting table 20 to the wafer carrying mechanism 40, the rods 17A of the cylinder mechanisms 17 are extended up under the control of the control unit, as shown in FIG. 5B. Accordingly, the two pairs of supporting bodies 12 are raised along the side surfaces of the mounting body 22 through the elevation guide mechanisms 15. Along with the upward movement of the two pairs of supporting bodies 12, the two wire materials 11 mount thereon the semiconductor wafer W and are raised from the grooves 13 of the mounting body 22 beyond the mounting surface by a predetermined distance, so that the semiconductor wafer is being ready to be transferred.

After the semiconductor wafer is being ready to be transferred, the wafer carrying mechanism 40 moves from the loader chamber toward a gap between the mounting surface of the mounting table 20 and the semiconductor wafer W, as illustrated in FIG. 5C. Next, the wafer carrying mechanism 40 moves up to receive the semiconductor wafer W on the two wire materials 11 and reaches a position slightly above the two wire materials 11. Then, the wafer carrying mechanism 40 transfers the semiconductor wafer W from the mounting table 20 to a predetermined position in the loader chamber. Thereafter, a next semiconductor wafer W to be inspected is transferred by the wafer carrying mechanism 40 from the loader chamber to above the mounting table 20, and then is mounted on the mounting table 20 through the processes shown in FIGS. 2A to 4. Next, the electrical characteristics of the semiconductor wafer W are inspected in the same manner described in the first embodiment.

As set forth above, in accordance with the second embodiment, the semiconductor wafer W can be transferred between the mounting body 22 and the wafer carrying mechanism 40 by vertically moving the two wire materials 11, and the vertical movement of the two wire materials 11 is performed by extending/contracting the cylindrical mechanisms 17 corresponding to the two pairs of supporting bodies 12 without vertically moving the mounting body 22. Accordingly, it is possible to obtain the operation effects same as those in the first embodiment.

Moreover, the present invention is not limited to the above-described embodiments, and the components thereof can be appropriately modified if necessary. For example, although two wire materials 11 are provided in the above-described embodiments, the number of wire materials may be three or more, and the number of supporting bodies may increase depending on the number of wire materials. In addition, the wire material is not particularly limited as long as it is an insulating material, and the first and the second elevation driving mechanism are not limited to those of the above-described embodiments.

The present invention can be preferably used as a transfer mechanism for a target object to be inspected which is used in a probe apparatus.

While the invention has been shown and described with respect to the embodiments, it will be understood by those skilled in the art that various changes and modification may be made without departing from the scope of the invention as defined in the following claims.

What is claimed is:

1. A transfer mechanism for a target object to be inspected which transfers the target object between a carrying mechanism and a mounting table in order to inspect electrical characteristics of the target object mounted on the mounting table of which temperature is controllable, the transfer mechanism comprising:

at least two insulating wire materials disposed spaced apart from each other to transverse the mounting table;

at least two pairs of supporting bodies disposed at outsides of the mounting table in a horizontal direction thereof, for stretching respective said at least two wire materials in parallel with a mounting surface of the mounting table;

at least two grooves formed on the mounting surface of the mounting table to respectively receive therein said at least two wire materials stretched by said at least two pairs of supporting bodies; and a first elevation driving mechanism for vertically moving said at least two wire materials between said at least two grooves and above of the mounting surface through said at least two pairs of supporting bodies, wherein the target object is transferred between the carrying mechanism and the mounting table through said at least two wire materials.

2. The transfer mechanism of claim 1, wherein the mounting table includes a mounting table main body, a mounting body movable vertically with respect to the mounting table main body, and a second elevation driving mechanism also serving as the first elevation driving mechanism for elevating the mounting body, wherein the mounting body has stopper plates to bring into contact with lower ends of the respective supporting bodies and elevation guide mechanisms for guiding vertical movement of the respective supporting bodies.

3. The transfer mechanism of claim 2, wherein each pair of the supporting bodies has therein respective spring member connected with opposite end of each of the wire materials, and the spring members apply tensile force to the respective wire materials.

4. The transfer mechanism of claim 1, wherein the mounting table includes a mounting table main body and a mounting body provided above the mounting table main body, and wherein the mounting body has at least two pairs of cylinder mechanisms as the first elevation driving mechanism, each pair connected with lower ends of said at least two pairs of supporting bodies and elevation guide mechanisms for guiding vertical movement of said at least two pairs of supporting bodies, respectively.

5. The transfer mechanism of claim 4, wherein each pair of the supporting bodies has therein respective spring member connected with opposite end of each of the wire materials, and the spring members apply tensile force to the respective wire materials.

6. The transfer mechanism of claim 1, wherein each pair of the supporting bodies has therein respective spring member connected with opposite end of each of the wire materials, and the spring members apply tensile force to the respective wire materials.

* * * * *